United States Patent [19]

Kirchlechner

[11] Patent Number: 5,245,668
[45] Date of Patent: Sep. 14, 1993

[54] DEVICE FOR AURALLY COMPENSATED LOUDNESS CONTROL

[75] Inventor: Peter Kirchlechner, Hohenthann, Fed. Rep. of Germany

[73] Assignee: SGS-Thomson Microelectronics GMBH, Fed. Rep. of Germany

[21] Appl. No.: 877,624

[22] Filed: May 1, 1992

[30] Foreign Application Priority Data

May 2, 1991 [DE] Fed. Rep. of Germany ....... 4114364

[51] Int. Cl.⁵ .............................................. H03G 9/00
[52] U.S. Cl. ..................................... 381/102; 381/109
[58] Field of Search ................... 381/98, 101, 102, 109

[56] References Cited

U.S. PATENT DOCUMENTS

| | | | |
|---|---|---|---|
| 3,452,282 | 6/1969 | Beres | 381/102 |
| 3,732,373 | 5/1973 | Boyden | 381/102 |
| 4,320,534 | 3/1982 | Sakai et al. | 381/102 |
| 4,363,934 | 12/1982 | Scholz . | |
| 5,127,059 | 6/1992 | Elion et al. | 381/98 |
| 5,138,665 | 8/1992 | Ito | 381/102 |

FOREIGN PATENT DOCUMENTS

2250725B2 4/1974 Fed. Rep. of Germany .
3132402A1 5/1982 Fed. Rep. of Germany .
229557A1 11/1985 Fed. Rep. of Germany .
158513 12/1981 Japan ................... 381/101

OTHER PUBLICATIONS

Peter Krüger, "Microcomputer-controlled audio preamplifier," *Electronics & Wireless World*, pp. 584–587, 1989.
Peter Zastrow, "Phonotechnik," Frankfurter Fachverlag, 3. Auflage (1984), pp. 141–144.

*Primary Examiner*—Forester W. Isen
*Attorney, Agent, or Firm*—Seed & Berry

[57] ABSTRACT

A device for digital aurally compensated loudness control of audio signals, comprising two fine-stepped resistor chains connected in a series connection which on one end is adapted to be acted upon by the audio signal to be attenuated and whose connection point has a correction impedance connected thereto, and comprising one coarse-stepped resistor chain which at one end receives the fine-attenuated audio signal taken off from one fine-stepped resistor chain and which has at least one feed-in terminal at a predetermined location along the coarse-stepped resistor chain into which is fed a fine-attenuated audio signal taken off from the other fine-stepped resistor chain. The output signal of the device is taken off from the coarse-stepped resistor chain.

18 Claims, 3 Drawing Sheets

DEVICE FOR AURALLY COMPENSATED LOUDNESS CONTROL

TECHNICAL FIELD

The invention relates to a device for aurally compensated loudness control of analog audio signals by attenuation thereof comprising a resistance divider means adapted to be acted upon on the one side by the audio signal to be attenuated and on the other side by a reference potential and being provided with a tapping means from which the attenuated audio signal can be taken off, the resistance divider means being connected to a correction impedance serving for aurally compensated loudness control, and the tapping means being controllable along the resistance divider means in selective manner with respect to the tapping of different resistance values, as a function of the desired loudness.

BACKGROUND OF THE INVENTION

Apparatus for rendering audio signals audible usually include a device for volume control. However, the perception of loudness of the human ear varies with frequency. In case of low sound pressures, low frequencies are felt to be less loud than high frequencies. This can be depicted in the form of a subjective perception intensity scale, for which also the term loudness is used. In the present paper, this will also be referred to as aurally compensated loudness.

With higher-quality audio equipment, for instance stereo sets or stereo car radios, this subjective perception intensity scale is taken into consideration by performing a physiologically matched loudness control.

A conventional physiologically matched, i.e., aurally compensated, loudness control which is shown in the book *Phono Technik* by P. Zastrow, Frankfurter Fachverlag, 1984, pages 141–144, and from which claim 1 starts, uses for loudness control a potentiometer connected between an audio signal source and ground. The potentiometer has a slidable tap and a fixed tap. The attenuated audio signal is taken off from the slidable tap. Between fixed tap and ground there is connected a capacitor serving for paying regard to auditory sensation. As the frequency of the audio signal increases, the resistance distance or path of the potentiometer between fixed tap and ground is increasingly bridged by the capacitor. While the position of the slidable tap remains the same, lower frequencies of the audio signal are thus attenuated to a lesser extent than high frequencies of the audio signal, i.e., lower frequencies are emphasized as compared to high frequencies.

Digitalization is increasingly gaining ground in audio equipment of the type mentioned. Desirable are devices rendering possible digital loudness control of an analog audio signal.

SUMMARY OF THE INVENTION

It is thus the object of the invention to make available a device for digital, aurally compensated loudness control of analog audio signals.

This object is met by a device of the type indicated at the outset, which is characterized in that the resistance divider means comprises for digital controllability of the device at least two fine-stepped resistor chains and one coarse-stepped resistor chain, with each resistor having one tap terminal associated therewith, that the tap terminals of each resistor chain have a tap selector means associated therewith that is controllable by means of a tap selection signal depending on the desired loudness, that the two fine-stepped resistor chains are interconnected so as to form a series connection adapted to be acted upon on one end by the audio signal to be attenuated and on the other end by the reference potential, that the connection point between the two fine-stepped resistor chains is connected to the correction impedance, that the coarse-stepped resistor chain has one end connected to that tap selector means that is associated with the fine-stepped resistor chain adapted to be acted upon by the audio signal to be attenuated, and on the other end is adapted to be acted upon by the reference potential, that the attenuated audio signal can be taken off from the tap selector means associated with the coarse-stepped resistor chain, and in that a feed-in means for feeding a correction signal into the coarse-stepped resistor chain, which takes the aural sensation characteristics into consideration, is connected between that tap selector means that is associated with the fine-stepped resistor chain acted upon by the reference potential, and at least one feed-in terminal at a predetermined location along the coarse-stepped resistor chain.

Such a device is suitable for performing in technically simple manner a physiologically matched loudness control of an analog audio signal in digital fashion.

Such a device preferably is provided in the form of an integrated semiconductor circuit or is formed in an integrated semiconductor circuit, with only the correction impedance being formed by an external component or several external components.

The correction impedance preferably is realized by a correction capacitor. The correction impedance may also be constituted, e.g., by an impedance network.

Preferred embodiments and developments of the device according to the invention are indicated in the dependent claims.

DETAILED DESCRIPTION OF THE INVENTION

Figure 1:
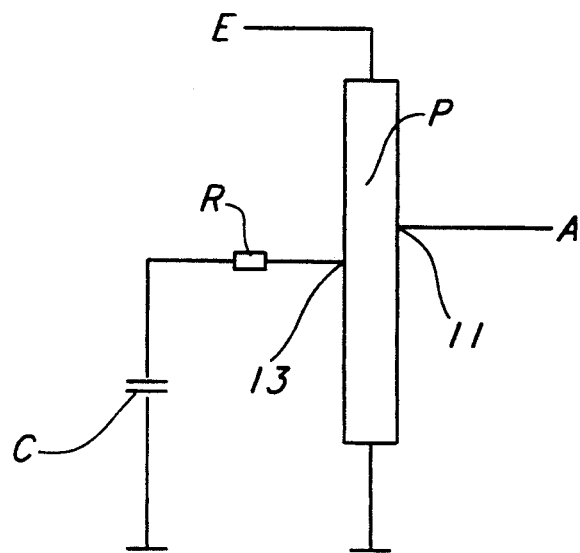
FIG. 1 shows a conventional device for aurally compensated loudness control using a potentiometer.

FIG. 1 illustrates a conventional potentiometer solution comprising a potentiometer P connected between a signal input E and ground. A slidable tap 11 of potentiometer P is connected to a signal output A. A fixed tap 13 of potentiometer P is connected to ground via a series connection of a resistor R and a capacitor C.

For adjusting the desired loudness of an audio signal supplied via the signal input E, the slidable tap 11 is brought into the desired tapping position. The audio signal is attenuated to a smaller or greater extent, corresponding to the resistance distance of potentiometer P between signal input E and slidable tap 11.

The aurally compensated, i.e., physiologically matched, loudness control is effected by capacitor C. With increasing frequency of the audio signal to be attenuated, the resistance distance between fixed tap 13 and ground of potentiometer P is increasingly bridged. When tap 11 is adjusted to high attenuation, lower frequencies thus are attenuated to a lesser extent than high frequencies. Thus, an aurally compensated emphasis of low frequencies in the spectrum of the audio signal to be attenuated takes place.

In modern apparatus solutions, attempts are made to avoid electromechanical components such as potentiometers. They are vulnerable, bulky and relatively expensive components. Furthermore, they are not suited for digital control, which is being increasingly employed.

Figure 2:
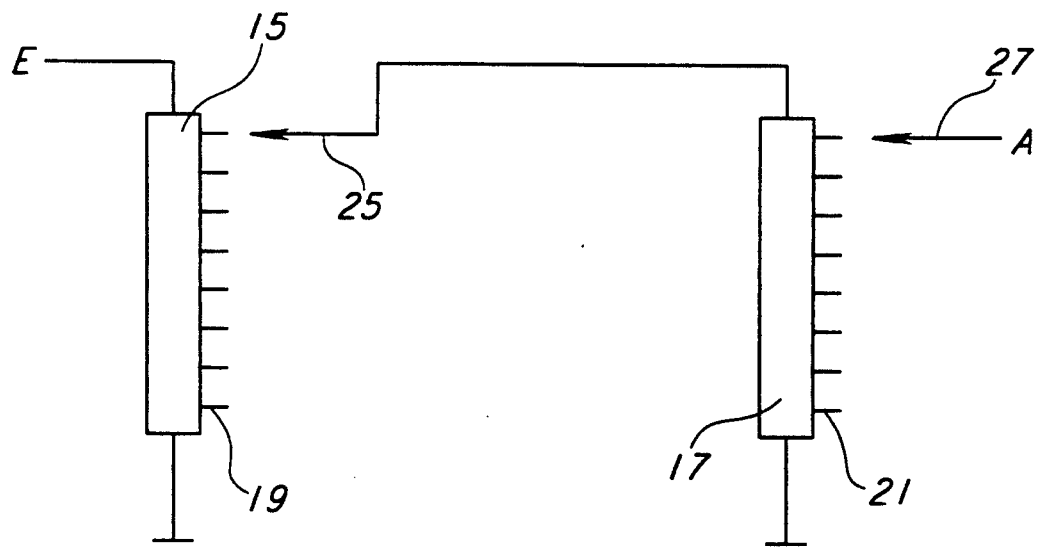
FIG. 2 shows a digitally controlled device for loudness control without paying attention to the aural sensation characteristics.

An example of a device for digital loudness control of an analog audio signal is shown in FIG. 2. This example provides two attenuation members in the form of a fine-stepped resistor chain 15 and a coarse-stepped resistor chain 17. Each resistor of each resistor chain 15, 17 has a tap terminal associated with it. In the example illustrated, each of the two resistor chains 15 and 17 has eight tap terminals 19 and 21, respectively. For the fine-stepped resistor chain 15, the attenuation steps between adjacent tap terminals 19 are, in this example, 1.25 dB. In the present example, the attenuation steps between adjacent tap terminals 21 of the coarse-stepped resistor chain are 10 dB. The fine-stepped resistor chain 15 is connected at one end to a signal input E and at the other end to ground. The coarse-stepped resistor chain 17 is acted upon on the one end by the fine-attenuated audio signal taken off from the fine-stepped resistor chain 15 and on the other end is connected to ground. The audio signal, additionally attenuated by the coarse-stepped resistor chain 17, is taken off from a signal output A.

The illustration in FIG. 2 is schematic in nature. It shows in simplified form a tap arrow 25 for the fine-stepped resistor chain 15 and a tap arrow 27 for the coarse-stepped resistor chain 17. In a practical embodiment, the individual tap terminals 19 and 21 are each connected via a controllable electronic switch (not shown) to a common line corresponding to tap arrow 25 and tap arrow 27, respectively. Depending on the desired loudness, i.e., depending on the required attenuation of the audio signal, one of the electronic switches associated with each of the tap terminals 19 and 21 is switched into the conductive state. Selection of the conductive switches in the embodiment according to FIG. 2 takes place with the aid of 6-bit code words, with three bits of the code word effecting the selection on the side of the fine-stepped resistor chain 15 and the remaining three bits effecting the selection on the side of the coarse-stepped resistor chain 17.

In the device for digital loudness control as depicted in FIG. 2, the principle of aurally compensated loudness control as shown in FIG. 1 cannot be realized.

Figure 3:
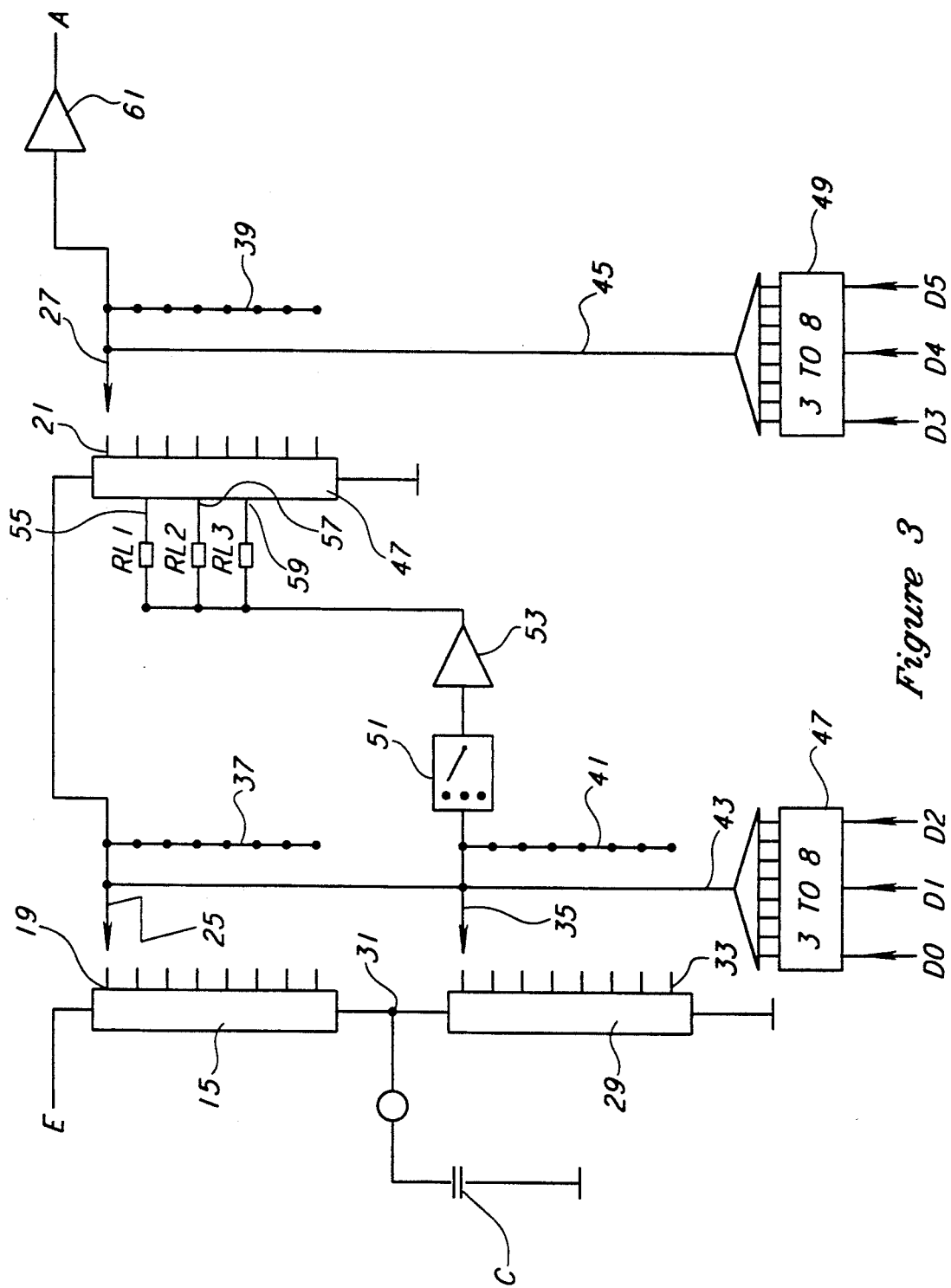
FIG. 3 shows a preferred embodiment of a device for digital aurally compensated loudness control according to the invention.

A device for aurally compensated digital loudness control of analog audio signals is shown in FIG. 3. This embodiment comprises all components of the loudness control device depicted in FIG. 2, with the same reference numerals being used in FIG. 3. However, contrary to FIG. 2, the end of the fine-stepped resistor chain 15 opposite to signal input E is not connected to ground directly, but via a second fine-stepped resistor chain 29 constituting a series connection with the first fine-stepped resistor chain 15. The two fine-stepped resistor chains 15 and 29 are connected to each other in a connection point 31. Between connection point 31 and ground, there is connected a capacitor C taking the aural sensation into consideration.

The second fine-stepped resistor chain 29 in the embodiment shown also comprises eight tap terminals 33. These terminals, in the schematic representation of FIG. 3, have a tap arrow 35 associated with them, which again constitutes a symbolic representation of eight electronic switches, which are each associated with one of the tap terminals 33 and of which there is always one switch that can be switched into the conductive state depending on the desired loudness attenuation. The individual tap arrows 25, 27 and 35 each has associated with it one row of eight switch symbols 37, 39, and 41, respectively, which are each arranged in the form of dots on a vertical line. Each of these dots represents one connecting end of an electronic switch (not shown), preferably a switching transistor, which is connected to the respectively opposed tap terminal 19, 21, or 33.

A bundle 43 of, in the present example, eight switch control lines leads to tap arrows 25 and 35. A bundle 45 of an equal number of switch control lines leads to tap arrow 27. The two control line bundles 43 and 45 are each connected to a decoder 47 and 49, respectively, sending from each 3-bit part word D0D1D2 and D3D4D5, respectively, a switch selection signal to a selected one of eight switch control lines. The two 3-bit part words are formed from a 6-bit word reflecting the desired loudness in digitally encoded manner and being stored, e.g., in a shift register having the bit outputs D0 to D5.

The two fine-stepped resistor chains 15 and 29 are tapped by the associated decoder 47 in synchronous and equivalent manner, corresponding to the switch selection signal. In other words, when, e.g., the third tap terminal 19 from the top of the fine-stepped resistor chain 15 is tapped by switching of the associated switching transistor into the conductive state, the third tap terminal 33 from the top of the fine-stepped resistor chain 29 is tapped at the same time by switching of the associated switching transistor into the conductive state.

The tap arrow 35 has a feed-in means connected down-stream thereof, comprising in a series connection an attenuation member 51, a buffer 53 and three resistors RL1, RL2 and RL3 connected in parallel. These resistors are commonly connected at one end to the output of buffer 53. Their respective other ends are each connected to a feed-in terminal 55, 57 and 59, respectively, of the coarse-stepped resistor chain 17.

Depending on the loudness selected, an audio signal attenuated in correspondingly fine manner is taken off from the first fine-stepped resistor chain 15 and supplied to one end of the coarse-stepped resistor chain 17. At the same time, a fine-attenuated audio signal is taken off from the corresponding tap terminal of the second fine-stepped resistor chain 29 and is fed via the attenuation member 51, the buffer 53 and the parallel resistors RL1 to RL3 to the three feed-in terminals 55, 57 and 59, respectively, of the coarse-stepped resistor chain 17. In this manner, still further audio signal portions are fed via feed-in terminals 55, 57 and 59 into the coarse-stepped resistor chain 17 in addition to the audio signal portion delivered via tap arrow 25. Due to the fact that the portion of the audio signal present across the second fine-stepped resistor chain 29 becomes increasingly lower as the frequency of the audio signal increases, feeding-in of additional audio signal portions via the feed-in terminals 55, 57 and 59 also becomes increasingly lower as the frequency increases. In the device depicted in FIG. 3, lower frequencies in the spectrum of the audio signal to be attenuated are emphasized in comparison with the signal portions of higher frequency.

The tap arrow 27 of the coarse-stepped resistor chain 17 is connected to signal output A via a second buffer 61.

Figure 4:
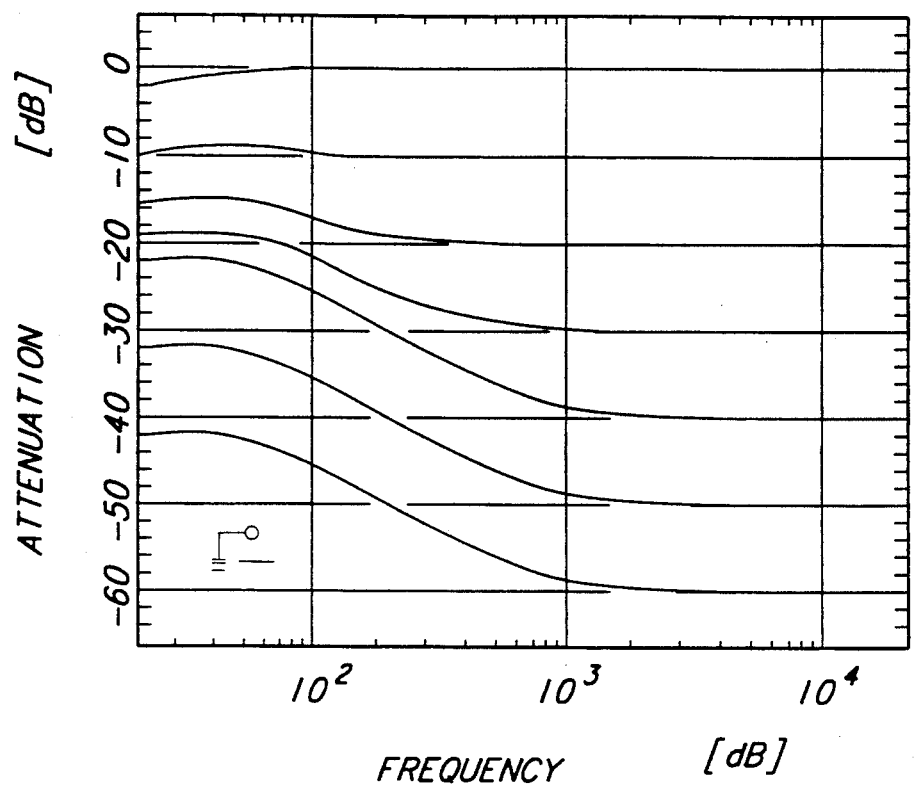
FIG. 4 illustrates the corrected loudness as a function of the frequency of the audio signal, for audio signals with different degrees of attenuation.
Figure 5:
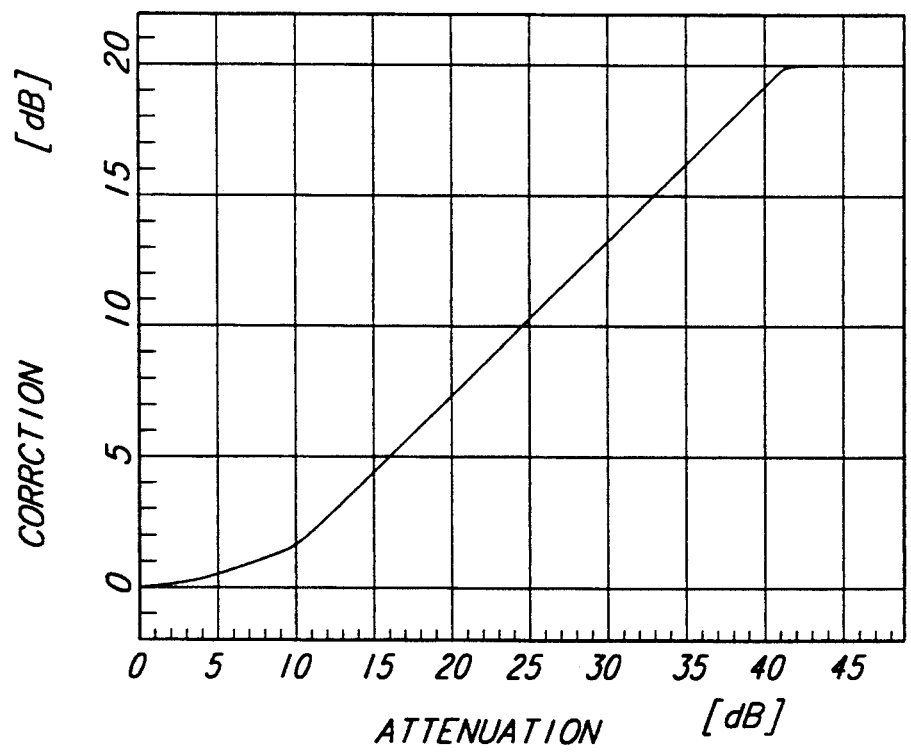
FIG. 5 illustrates an example of an aurally compensated correction as a function of loudness attenuation in a device according to the invention.

The effect of the device according to the invention as shown in FIG. 3 will now be elucidated in more detail by way of FIGS. 4 and 5.

FIG. 4 shows a representation of the loudness as a function of frequency, having loudness attenuation values of different intensity as parameters. It can be seen that the attenuation is considerably lower for low-frequency signal portions than for high-frequency signal portions. The presentation of FIG. 4 shows, furthermore, that the emphasis of the low-frequency signal portions in comparison with the high-frequency portions is greater the higher the loudness attenuation, i.e., the lower the volume of the audible audio signal.

FIG. 5 depicts the characteristics for the emphasis of low audio frequencies (bass frequencies) as a function of loudness attenuation. The individual characteristic line parts of FIG. 5 are realized by the resistance values of the resistors RL1 to RL3 and the position of the feed-in terminals 55, 57, 59 along the coarse-stepped resistor chain 17.

The attenuation member 51 serves to smooth the quantization steps which are produced due to the fact that the resistor chains 15, 17 and 29 are not continuously adjustable potentiometers, but discontinuous resistor chains, which leads to quantization steps. These steps are of different dimensions, depending on whether a change between adjacent tap terminals 21 of the coarse-stepped resistor chain 17 or a change between adjacent tap terminals 19 and 33, respectively, of the two fine-stepped resistor chains 15 and 29, respectively, takes place in the particular situation. With the aid of attenuation member 51, signal portions are taken off from selected tap terminals 33 of the second fine-stepped resistor chain 29 and in combination are superimposed on the signal value coming from tap arrow 35, such that the quantization steps are smoothed to a large extent.

The device for digital aurally compensated loudness control, as shown in FIG. 3, is effective for high frequencies for which capacitor C, which constitutes correction impedance, forms a short circuit towards ground, like the loudness control device without consideration of the aural sensation a shown in FIG. 2. In this case, the output of the first buffer 53 in terms of alternating voltage is connected to ground. The coarse-stepped resistor chain 17 thus performs attenuation steps of 10 dB for the fine-attenuated audio signal supplied thereto.

As regards low-frequency signal portions of the audio signal to be attenuated, capacitor C has a high impedance. In this case, an attenuated audio signal or an alternating voltage portion is fed via the first buffer 53 and the three resistors RL1 to RL3 into the feed-in terminals 55, 57, and 59 of the coarse-stepped resistor chain 17. This results in the emphasis of the low-frequency signal portion, i.e., of the bass frequency range, as a function of the design of the fine-stepped resistor chains 15 and 29 and the coarse-stepped resistor chain 17, which in the embodiment concerned effect attenuation steps of 1.25 dB and 10 dB, respectively.

The entire device shown in FIG. 3 is preferably monolithically integrated, with the exception of capacitor C which is an external component part of the integrated circuit.

I claim:

1. A device for aurally compensated loudness control of analog audio signals by attenuation, comprising:

a resistance divider means having two sides and a tapping means and being adapted to be acted upon on the one side by the audio signal to be attenuated and on the other side by a reference potential, the attenuated audio signal being taken off from said tapping means;

a correction impedance connected to the resistance divider means and serving for aurally compensated loudness control;

the tapping means being controllable in selective manner with respect to the tapping of different resistance values, as a function of the desired loudness;

wherein:

the resistance divider means comprises for digital controllability of the device at least two fine-stepped resistor chains and one coarse-stepped resistor chain, with each resistor having one tap terminal associated therewith;

the tap terminals of each resistor chain have a tap selector means associated therewith that is controllable by means of a tap selection signal depending on the desired loudness;

the two fine-stepped resistor chains are interconnected so as to form a series connection adapted to be acted upon on one end by the audio signal to be attenuated and on the other end by the reference potential;

the connection point between the two fine-stepped resistor chains is connected to the correction impedance (C);

the coarse-stepped resistor chain has one end connected to the tap selector means associated with the fine-stepped resistor chain adapted to be acted upon by the audio signal to be attenuated, and on the other end is adapted to be acted upon by the reference potential;

the attenuated audio signal can be taken off from the tap selector means associated with the coarse-stepped resistor chain; and a feed-in means for feeding a correction signal into the coarse-stepped resistor chain, which takes the aural sensation characteristics into consideration, is connected between the tap selector means associated with the fine-stepped resistor chain acted upon by the reference potential, and at least one feed-in terminal at a predetermined location along the coarse-stepped resistor chain.

2. A device according to claim 1 wherein the correction impedance comprises a capacitor (C).

3. A device according to claim 1 wherein the two fine-stepped resistor chains are of identical construction.

4. A device according to claim 1 wherein said tap selector means of the two fine-stepped resistor chains are controlled by the same tap selection signal, such that these two tap selector means always select simultaneously equivalent tap terminals of the two fine-stepped resistor chains.

5. A device according to claim 1 wherein each tap selector means comprises a number of controllable electronic switches corresponding in number to the tap terminals and being connected on the input side to one associated tap terminal each and being all interconnected on the output side, with a respective one of said switches being switched into the conductive state as a function of the tap selection signal.

6. A device according to claim 1 wherein a shift register means is provided having stored therein a code signal corresponding to the particular loudness desired, and wherein a decoder means is provided generating from the stored code signal the tap selection signal for the tap selector means of each resistor chain.

7. A device according to claim 1 wherein the feed-in means comprises several output terminals each connected to one of a plurality of feed-in terminals arranged at predetermined locations along the coarse-stepped resistor chain.

8. A device according to claim 1 wherein the feed-in means comprises a controllable smoothing means effecting at least partial smoothing of the quantization steps in the attenuated audio signal caused by the resistor chain.

9. A device according to claim wherein the smoothing means applies a controllable smoothing signal to the output signal of the tap selector means associated with the fine-stepped resistor chain acted upon by the reference potential.

10. A device according to claim 9 wherein the smoothing signal can be taken off in controllable selection of predetermined tap terminals of the resistor chain acted upon by the reference potential.

11. An apparatus for aurally compensated loudness control of an analog audio signal by attenuation of the audio signal, the apparatus comprising:

first and second fine resistance divider chains each having a plurality of resistor taps, a first end of said first resistance divider chain receiving the analog signal, a second end of said first resistance divider chain coupled in series to a first end of said second resistance divider chain, and a second end of said second resistance divider chain coupled to a reference voltage;

an impedance coupled between said reference voltage and the series connection point of said first and second resistance divider chains;

first and second fine selector switches each having a single output pole and a plurality of inputs corresponding to the number of resistor taps in said first and second resistance divider chains, said first and second selection switches allowing only a single selected output tap from each of said first and second resistance divider chains to be coupled to the respective output poles of said first and second selector switches, respectively;

a coarse resistance divider chain having a plurality of resistor taps, a first end of said coarse resistance divider chain coupled to the first output pole and a second end of said coarse resistance divider chain coupled to said reference voltage, and at least one feed-in terminal coupled to said second output pole; and a coarse selector switch having a single coarse output pole and a plurality of inputs corresponding to the number of resistor taps in said coarse resistance divider chain, said coarse selector switch allowing only a single selected output tap from said coarse resistance divider chain to be coupled to said coarse output pole, whereby said first resistance divider chain attenuates the analog signal without any aural compensation, said second fine resistance divider chain and said impedance provide aural compensation to the analog signal and said coarse attenuation receives the uncompensated analog signal from said first fine resistance divider chain adds the compensated analog signal from said second resistance divider chain to the uncompensated signal.

12. The apparatus of claim 11 wherein said first and second fine selector switches and said coarse selector switch are digitally controlled solid-state analog switches.

13. The apparatus of claim 12 wherein said solid-state analog switches are controlled by a plurality of digital decoders.

14. The apparatus of claim 12 wherein said first and second fine selector switches are digitally controlled by the same digital decoder whereby said first and second fine selector switch output poles are always coupled to the corresponding resistor taps in said first and second resistance divider chains, respectively.

15. The apparatus of claim 11 wherein said impedance is a capacitor.

16. The apparatus of claim 11, further including a means for smoothing the compensated signal from said second fine selector switch output poles.

17. The apparatus of claim 11 wherein all elements except said impedance are integrated into an integrated circuit.

18. A method of aurally compensating the loudness control of an analog audio signal by attenuating the audio signal, the method comprising the steps of:

attenuating the analog signal through a first fine resistance divider chain having a plurality resistor taps, a first end of said first resistance divider chain receiving the analog signal, a second end of said first resistance divider chain coupled in series to a first end of a second resistance divider chain;

attenuating the analog signal through said second fine resistance divider chain having a plurality resistor taps, said first end of said second resistance divider chain being coupled in series to said second end of said first fine resistance divider chain and a second end of said second resistance divider chain coupled to a reference voltage;

inserting an impedance between said reference voltage and said first end of said second resistance divider chain to provide aural compensation of the analog signal;

selecting an attenuation value using first and second fine selector switches each having a single output pole and a plurality of inputs corresponding to the number of resistor taps in said first and second resistance divider chains, said first and second selection switches allowing only a single selected output tap from each of said first and second resistance divider chains to be coupled to said output pole on said first and second selector switches, respectively;

attenuating the analog signal through a coarse resistance divider chain having a plurality resistor taps, a first end of said coarse resistance divider chain coupled to the first output pole and a second end of said coarse resistance divider chain coupled to said reference voltage, and at least one feed-in terminal coupled to the second output pole;

selecting an attenuation value using a coarse selector switch having a single coarse output pole and a plurality of inputs corresponding to the number of resistor taps in said coarse resistance divider chain, said coarse selector switch allowing only a single selected output tap from said coarse resistance divider chains to be coupled to said coarse output pole, whereby said first resistance divider chain attenuates the analog signal without any aural compensation, said second fine resistance divider chain and said impedance provide aural compensation to the analog signal and said coarse resistance divider chain receives the uncompensated analog signal from said first fine resistance divider chain and adds the compensated analog signal from said second resistance divider chain to the uncompensated signal.

* * * * *

UNITED STATES PATENT AND TRADEMARK OFFICE
CERTIFICATE OF CORRECTION

PATENT NO. : 5,245,668
DATED : September 14, 1993
INVENTOR(S) : Peter Kirchlechner It is certified that error appears in the above-identified patent and that said Letters Patent is hereby corrected as shown below:

In column 7, claim 9, line 26, please insert --1-- between "claim" and "wherein".

Signed and Sealed this

Nineteenth Day of April, 1994

Attest:

BRUCE LEHMAN

*Attesting Officer*  *Commissioner of Patents and Trademarks*